(12) United States Patent
Yi et al.

(10) Patent No.: US 9,474,161 B2
(45) Date of Patent: Oct. 18, 2016

(54) CIRCUIT SUBSTRATE HAVING A CIRCUIT PATTERN AND METHOD FOR MAKING THE SAME

(71) Applicant: Taiwan Green Point Enterprises Co., Ltd., Taichung (TW)

(72) Inventors: Sheng-Hung Yi, Taichung (TW); Pen-Yi Liao, Taichung (TW)

(73) Assignee: Taiwan Green Point Enterprises Co., Ltd., Taichung (TW)

( * ) Notice: Subject to any disclaimer, the term of this patent is extended or adjusted under 35 U.S.C. 154(b) by 0 days.

(21) Appl. No.: 14/933,616

(22) Filed: Nov. 5, 2015

(65) Prior Publication Data
US 2016/0057865 A1    Feb. 25, 2016

Related U.S. Application Data

(60) Division of application No. 13/547,494, filed on Jul. 12, 2012, now abandoned, which is a continuation-in-part of application No. 13/035,531, filed on Feb. 25, 2011, now Pat. No. 8,621,749.

(60) Provisional application No. 61/313,367, filed on Mar. 12, 2010.

(51) Int. Cl.
*H01B 13/00* (2006.01)
*H05K 3/00* (2006.01)
(Continued)

(52) U.S. Cl.
CPC .......... *H05K 3/0026* (2013.01); *B23K 26/362* (2013.01); *B23K 26/364* (2015.10);
(Continued)

(58) Field of Classification Search
CPC ............... H05K 2201/09563; H05K 3/0041; H05K 2203/0392; H05K 3/107; B81C 1/00095

USPC .................................. 216/13, 17, 18, 65, 94
See application file for complete search history.

(56) References Cited

U.S. PATENT DOCUMENTS 3,754,939 A    8/1973  Pearlstein et al.
3,781,596 A    12/1973 Galli et al.
(Continued)

FOREIGN PATENT DOCUMENTS

JP    05-065687    3/1993
JP    H10209607   8/1998
(Continued)

OTHER PUBLICATIONS

Dai, Wen et al. "Selective metallization of cured SU-8 microstructures using electroless plating method", MEMS-2006, Sep. 2006, 8 pages.
(Continued)

*Primary Examiner* — Binh X Tran
(74) *Attorney, Agent, or Firm* — Volpe and Koenig, P.C.

(57) ABSTRACT

A circuit substrate includes: an insulative substrate formed with a pattern of a recess, the recess being defined by a recess-defining wall that has a bottom wall surface and a surrounding wall surface extending upwardly from the bottom wall surface; a patterned metallic layer structure including at least a patterned active metal layer disposed within the recess, formed on the bottom wall surface of the recess-defining wall, and spaced apart from the surrounding wall surface of the recess-defining wall, the patterned active metal layer containing an active metal capable of initiating electroless plating; and a primary metal layer plated on the patterned metallic layer structure.

20 Claims, 8 Drawing Sheets

(51) Int. Cl.

| | | |
|---|---|---|
| *C23C 18/16* | (2006.01) | |
| *C25D 5/02* | (2006.01) | |
| *H05K 3/18* | (2006.01) | |
| *B23K 26/36* | (2014.01) | |
| *B23K 26/40* | (2014.01) | |
| *C25D 3/12* | (2006.01) | |
| *C25D 3/38* | (2006.01) | |
| *C25D 3/46* | (2006.01) | |
| *C25D 3/48* | (2006.01) | |
| *C25D 7/12* | (2006.01) | |
| *C25F 5/00* | (2006.01) | |
| *H05K 3/06* | (2006.01) | |
| *H05K 3/46* | (2006.01) | |
| *C25D 5/54* | (2006.01) | |
| *C23C 18/20* | (2006.01) | |
| *H05K 3/24* | (2006.01) | |
| *H05K 3/02* | (2006.01) | |
| *H05K 3/10* | (2006.01) | |

(52) U.S. Cl.
CPC ......... *B23K26/402* (2013.01); *C23C 18/1603* (2013.01); *C23C 18/1653* (2013.01); *C23C 18/1689* (2013.01); *C23C 18/2013* (2013.01); *C25D 3/12* (2013.01); *C25D 3/38* (2013.01); *C25D 3/46* (2013.01); *C25D 3/48* (2013.01); *C25D 5/02* (2013.01); *C25D 5/54* (2013.01); *C25D 7/12* (2013.01); *C25F 5/00* (2013.01); *H05K 3/0041* (2013.01); *H05K 3/067* (2013.01); *H05K 3/185* (2013.01); *H05K 3/4661* (2013.01); *B23K 2201/34* (2013.01); *B23K 2201/40* (2013.01); *B23K 2203/56* (2015.10); *H05K 3/027* (2013.01); *H05K 3/107* (2013.01); *H05K 3/24* (2013.01); *H05K 2201/09036* (2013.01); *H05K 2201/09363* (2013.01); *H05K 2203/0392* (2013.01); *H05K 2203/107* (2013.01); *Y10T 29/49155* (2015.01)

(56) References Cited

U.S. PATENT DOCUMENTS

| | | |
|---|---|---|
| 3,853,589 A | 12/1974 | Andrews |
| 4,001,470 A | 1/1977 | Schulze-Berge |
| 4,066,804 A | 1/1978 | Andrews |
| 4,264,646 A | 4/1981 | Thornburg et al. |
| 4,574,095 A | 3/1986 | Baum et al. |
| 4,790,912 A | 12/1988 | Holtzman et al. |
| 4,865,873 A | 9/1989 | Cole, Jr. et al. |
| 4,877,644 A | 10/1989 | Wu et al. |
| 4,882,200 A | 11/1989 | Liu et al. |
| 4,898,648 A | 2/1990 | Cusano |
| 4,925,522 A | 5/1990 | Avellino et al. |
| 4,946,563 A | 8/1990 | Yeatts |
| 4,963,701 A | 10/1990 | Yasumoto et al. |
| 4,988,412 A | 1/1991 | Liu et al. |
| 5,084,299 A | 1/1992 | Hirsch et al. |
| 5,086,966 A | 2/1992 | Melton et al. |
| 5,340,773 A | 8/1994 | Yamamoto |
| 5,494,781 A | 2/1996 | Ohtani et al. |
| 5,525,204 A | 6/1996 | Shurboff et al. |
| 5,924,364 A | 7/1999 | Grabley et al. |
| 6,162,365 A | 12/2000 | Bhatt et al. |
| 6,188,391 B1 | 2/2001 | Seely et al. |
| 6,242,156 B1 | 6/2001 | Teng |
| 6,261,671 B1 | 7/2001 | Asai et al. |
| 6,291,093 B1 | 9/2001 | Kindler et al. |
| 6,325,910 B1 | 12/2001 | Meyer et al. |
| 6,359,233 B1 | 3/2002 | Joy et al. |
| 6,515,233 B1 | 2/2003 | Labzentis et al. |
| 6,563,057 B2 | 5/2003 | Hotta et al. |
| 6,696,173 B1 | 2/2004 | Naundorf et al. |
| 6,773,760 B1 | 8/2004 | Sung et al. |
| 6,801,438 B1 | 10/2004 | Castro |
| 6,908,534 B2 | 6/2005 | Hongo et al. |
| 7,060,421 B2 | 6/2006 | Naundorf et al. |
| 7,257,891 B2 | 8/2007 | Lee et al. |
| 7,276,267 B2 | 10/2007 | Schauz |
| 7,279,407 B2 | 10/2007 | Akram et al. |
| 7,291,380 B2 | 11/2007 | Nyholm et al. |
| 7,365,006 B1 | 4/2008 | Huemoeller et al. |
| 7,608,305 B2 | 10/2009 | Chan et al. |
| 7,656,393 B2 | 2/2010 | King et al. |
| 7,674,647 B2 | 3/2010 | Arai |
| 7,719,522 B2 | 5/2010 | Lyon et al. |
| 7,754,601 B2 | 7/2010 | Chen et al. |
| 7,779,522 B2 | 8/2010 | Chen et al. |
| 7,935,559 B1 | 5/2011 | Giffard et al. |
| 8,621,749 B2 | 1/2014 | Yi et al. |
| 8,692,790 B2 | 4/2014 | Yi et al. |
| 8,952,919 B2 | 2/2015 | Yi et al. |
| 2002/0119251 A1 | 8/2002 | Chen et al. |
| 2003/0165633 A1 | 9/2003 | Ryu et al. |
| 2003/0214486 A1 | 11/2003 | Roberts |
| 2004/0149986 A1 | 8/2004 | Dubowski et al. |
| 2005/0112432 A1 | 5/2005 | Erlebacher et al. |
| 2006/0030128 A1 | 2/2006 | Bu et al. |
| 2006/0115982 A1 | 6/2006 | Morisue et al. |
| 2007/0004200 A1 | 1/2007 | Akram et al. |
| 2007/0059449 A1 | 3/2007 | Ryu et al. |
| 2007/0097154 A1 | 5/2007 | Kojima |
| 2007/0148420 A1 | 6/2007 | Salama et al. |
| 2007/0247822 A1 | 10/2007 | Naundorf |
| 2007/0261232 A1 | 11/2007 | Landsberger et al. |
| 2008/0001297 A1 | 1/2008 | Lotz et al. |
| 2009/0188708 A1 | 7/2009 | En et al. |
| 2009/0277672 A1 | 11/2009 | Matsumoto |
| 2009/0288593 A1 | 11/2009 | Rulkens et al. |
| 2009/0298256 A1 | 12/2009 | Chen et al. |
| 2010/0026656 A1 | 2/2010 | Hotelling et al. |
| 2010/0136735 A1 | 6/2010 | Arai |
| 2010/0258173 A1 | 10/2010 | Laia et al. |
| 2010/0259173 A1 | 10/2010 | Zhang |
| 2011/0215477 A1 | 9/2011 | Chen et al. |
| 2011/0278050 A1 | 11/2011 | Yi et al. |
| 2012/0086101 A1* | 4/2012 | DeMuynck ....... H01L 21/76834 257/531 |
| 2012/0193322 A9* | 8/2012 | Lee ................... H01L 21/76805 216/13 |
| 2012/0235779 A1* | 9/2012 | Baram ................... H01F 5/003 336/200 |
| 2012/0264288 A1* | 10/2012 | Furuya ............... H01L 21/2885 438/627 |
| 2012/0267155 A1* | 10/2012 | Kung ...................... H05K 3/28 174/261 |
| 2012/0267759 A1* | 10/2012 | Shroff ................. H01L 27/0629 257/532 |
| 2012/0273261 A1 | 11/2012 | Yi et al. |
| 2012/0278050 A1 | 11/2012 | Hsiao et al. |
| 2013/0027842 A1* | 1/2013 | Kim ...................... H01G 4/30 361/321.2 |
| 2014/0102775 A1 | 4/2014 | Yi et al. |
| 2014/0116885 A1 | 5/2014 | Yi et al. |
| 2014/0183020 A1 | 7/2014 | Yi et al. |

FOREIGN PATENT DOCUMENTS

| | | |
|---|---|---|
| JP | 11-097824 | 4/1999 |
| JP | 2003-029425 | 1/2003 |
| TW | I250223 | 3/2006 |
| TW | 200952117 | 12/2009 |
| WO | 2005054120 | 6/2005 |
| WO | 2009142497 | 11/2009 |

OTHER PUBLICATIONS

Grojo, D. et al. "Experimental investigation of ablation mechanisms involved in dry laser cleaning", Applied Surface Science, vol. 253, Issue 19, Jul. 31, 2007, pp. 8309-8315.

(56) References Cited

OTHER PUBLICATIONS

International Preliminary Report on Patentability for PCT/US12/26182, mailed Feb. 19, 2013.
International Search Report for PCT/US12/26182, mailed Jun. 5, 2012, with the Statement in Response to International Search Report filed by Applicant.
Lu, Y.F. et al. "Laser induced removal of spherical particles from silicon wafers", Journal of Applied Physics, vol. 87, Oct. 1999, pp. 1534-1539.
Niino, Hiroyuki et al. "Positively charged surface potential polymer films after excimer laser ablation: Application to selective-area electroless plating on the ablated films", Applied Physics Letters, vol. 60, 1992, 3 pages.
Wang, Z.B. et al. "Angle Effect in Laser Nanopatterning with Particle-Mask", Journal of Applied Physics, vol. 96, Issue 11, Dec. 2004, pp. 6845-6850.
Wu, X. et al. "The Modeling of Excimer Laser Particle Removal from Hydrophilic Silicon Surfaces", Journal of Applied Physics, vol. 87 (3618), Jan. 2000, pp. 3618-3627.
Zheng, Y.W. et al. "Dry laser cleaning of particles from solid substrates: experiments and theory", Journal of Applied Physics, vol. 90, No. 5, Sep. 2001, pp. 2135-2142.

* cited by examiner

US 9,474,161 B2

CIRCUIT SUBSTRATE HAVING A CIRCUIT PATTERN AND METHOD FOR MAKING THE SAME

CROSS-REFERENCE TO RELATED APPLICATIONS

This application is a divisional of U.S. patent application Ser. No. 13/547,494, filed Jul. 12, 2012, which is a continuation-in-part (CIP) of U.S. patent application Ser. No. 13/035,531, filed on Feb. 25, 2011, which issued as U.S. Pat. No. 8,621,749 on Jan. 7, 2014, which claims the benefit of U.S. Provisional Application Ser. No. 61/313,367, filed Mar. 12, 2010.

The entire disclosures of which are incorporated herein by reference.

FIELD OF INVENTION

The invention relates to a circuit substrate having a circuit pattern and a method for making the same, and more particularly to a circuit substrate having a circuit pattern formed in a recess in a substrate.

BACKGROUND

Conventionally, methods of forming a circuit substrate having a circuit pattern on an insulative substrate can be performed by insert molding the circuit pattern into the insulative substrate or by laminating the circuit pattern with the insulative substrate. However, the aforesaid conventional methods can undesirably increase the thickness of the circuit substrate. Moreover, when the circuit pattern is modified or changed, adjustment of manufacturing equipments in the processing steps of the conventional method is time consuming.

U.S. Pat. No. 4,865,873 discloses a method for making a circuit substrate having a circuit pattern on a substrate. The method includes forming an insulating layer on a substrate, forming a water-soluble layer on the insulating layer, forming a patterned hole extending through the water-soluble layer and the insulating layer by laser ablation, forming an active metal layer in the patterned hole and on the water-soluble layer, and simultaneously electroless depositing a primary metal layer on the active metal layer and dissolving the water-soluble layer in an aqueous plating solution. Since the active metal layer covers a hole wall of the patterned hole as well as the water-soluble layer, electroless plating of the primary metal layer takes place not only at the hole wall but also at the surface of the water-soluble layer, which is undesirable. Although the water-soluble layer will be gradually dissolved in the aqueous plating solution during electroless plating, it can have an adverse effect on electroless plating. In addition, the thickness of the circuit substrate thus formed is considerably increased.

SUMMARY

Therefore, an object of the present invention is to provide a circuit substrate that can overcome the aforesaid drawbacks associated with the prior art.

According to one aspect of the present invention, there is provided a circuit substrate that comprises: an insulative substrate having a top surface and formed with a pattern of a recess that is indented from the top surface, the recess being defined by a recess-defining wall that has a bottom wall surface and a surrounding wall surface extending upwardly from the bottom wall surface; a patterned metallic layer structure including at least a patterned active metal layer that is disposed within the recess, that is formed on the bottom wall surface of the recess-defining wall, and that is spaced apart from the surrounding wall surface of the recess-defining wall, the patterned active metal layer containing an active metal capable of initiating electroless plating, a pattern of the patterned active metal layer corresponding in shape to the pattern of the recess; and a primary metal layer plated on the patterned metallic layer structure.

According to another aspect of the present invention, there is provided a method for making a circuit substrate having a circuit pattern. The method comprises: (a) providing an insulative substrate having a top surface; (b) forming a pattern of a recess in the insulative substrate such that the recess is indented from the top surface, the recess being defined by a recess-defining wall having a bottom wall surface and a surrounding wall surface extending upwardly from the bottom wall surface; (c) forming a metallic layer structure on the recess-defining wall of the recess and the top surface of the insulative substrate, the metallic layer structure including at least one active metal layer containing an active metal capable of initiating electroless plating; (d) removing a portion of the metallic layer structure that is disposed along a peripheral edge of the bottom wall surface of the recess-defining wall so as to form the metallic layer structure into a first region which is disposed on the bottom wall surface, and a second region which is physically separated from the first region; and (e) plating a primary metal layer on the first region of the metallic layer structure.

BRIEF DESCRIPTION OF THE DRAWING(S)

In drawings which illustrate embodiments of the invention,

DETAILED DESCRIPTION OF THE PREFERRED EMBODIMENTS

Figure 1:
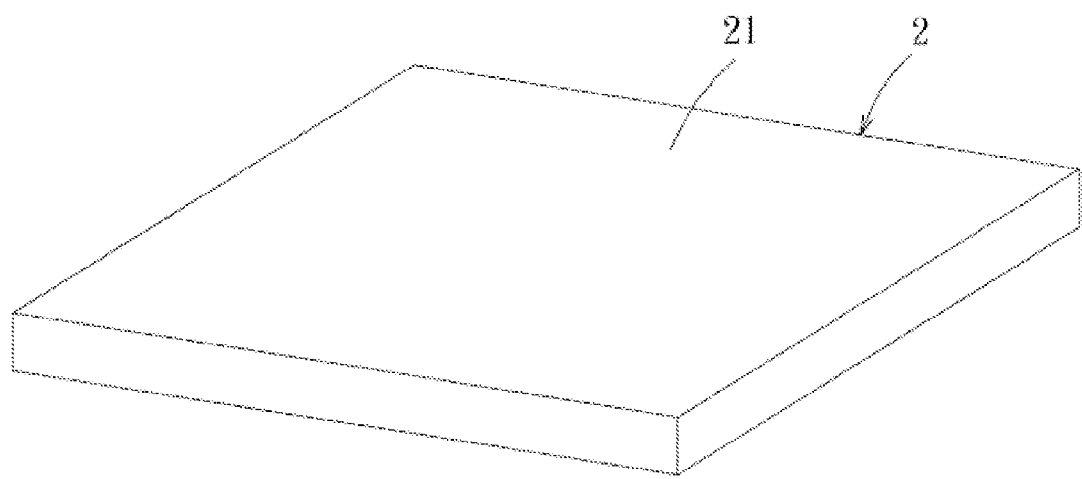
FIG. 1 is a perspective view illustrating a first step of a method for making the first preferred embodiment of a circuit substrate according to the present invention.
Figure 2:
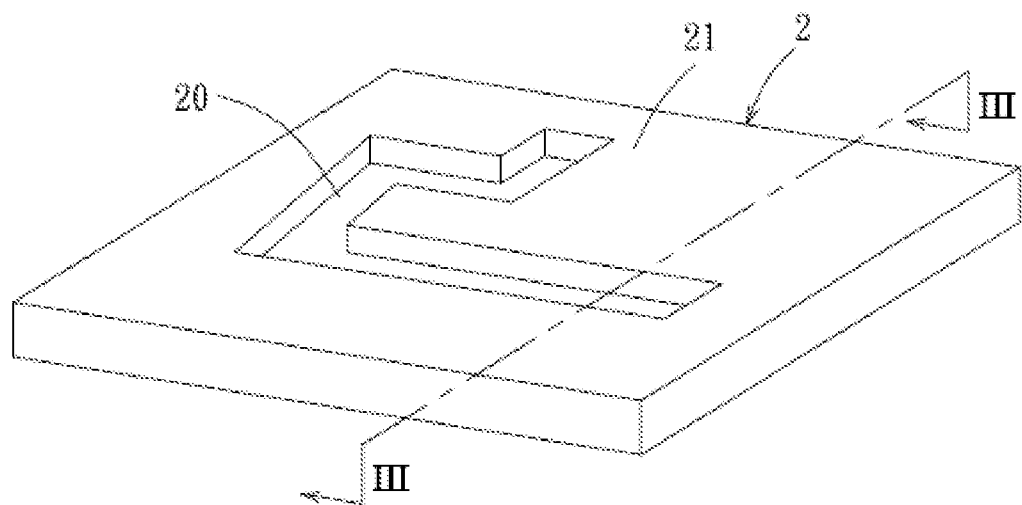
FIG. 2 is a perspective view illustrating a second step of the method for making the first preferred embodiment.
Figure 3:
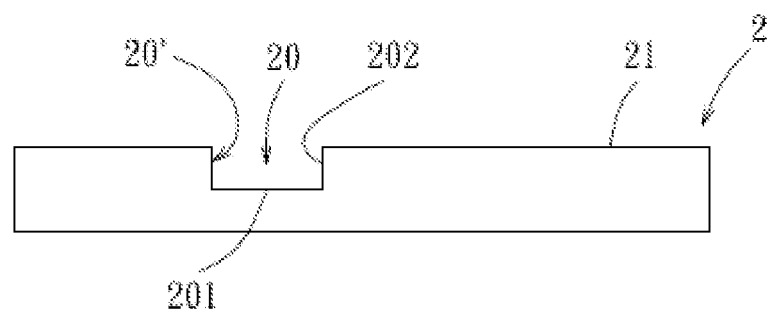
FIG. 3 is a schematic view taken along line III-III of FIG. 2.
Figure 4:
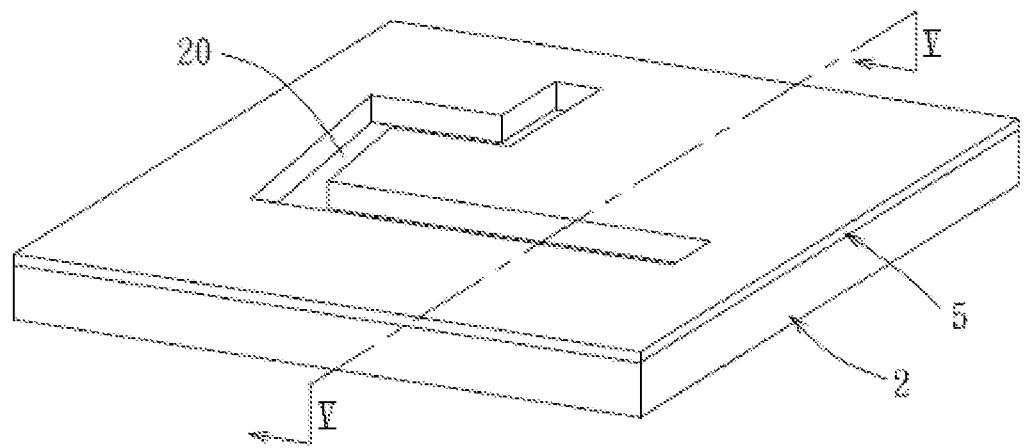
FIG. 4 is a perspective view illustrating a third step of the method for making the first preferred embodiment.
Figure 5:
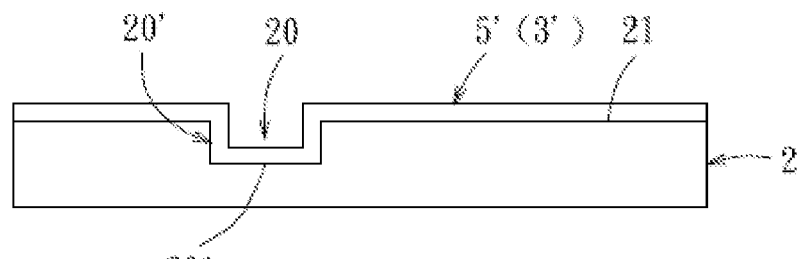
FIG. 5 is a schematic view taken along line V-V of FIG. 4.
Figure 6:
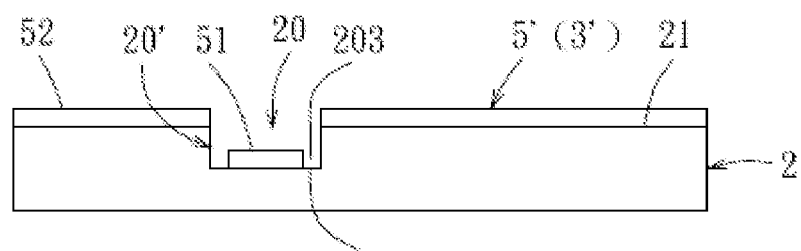
FIG. 6 is a schematic view illustrating a fourth step of the method for making the first preferred embodiment.
Figure 7:
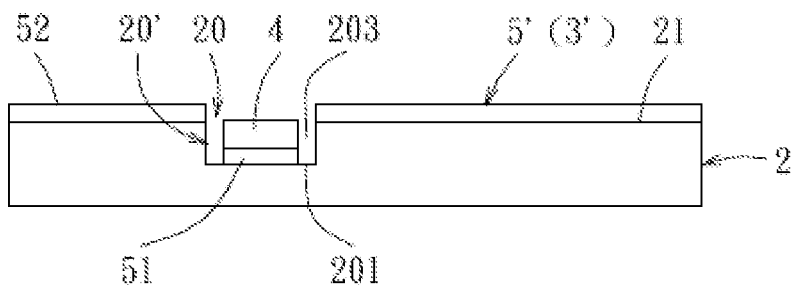
FIG. 7 is a schematic view illustrating a fifth step of the method for making the first preferred embodiment.

Before the present invention is described in greater detail with reference to the accompanying preferred embodiments, it should be noted herein that like elements are denoted by the same reference numerals throughout the disclosure.

Figure 8:
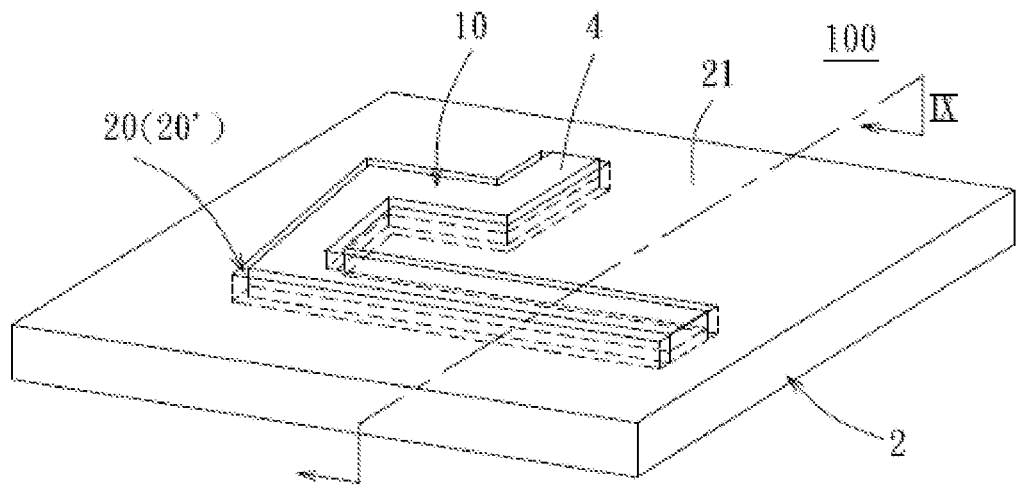
FIG. 8 is a perspective view illustrating a sixth step of the method for making the first preferred embodiment.
Figure 9:
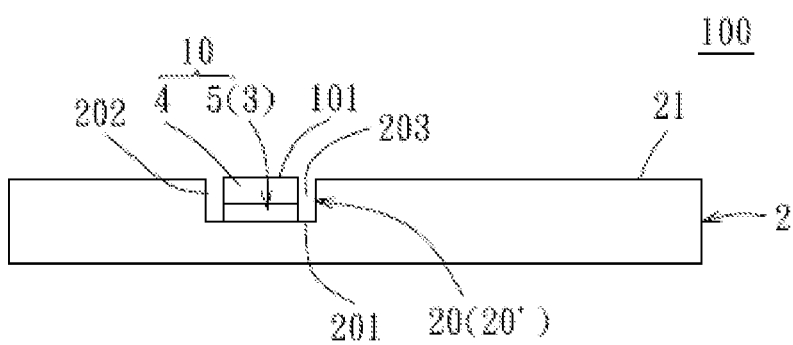
FIG. 9 is a schematic view taken along line IX-IX of FIG. 8.
Figure 10:
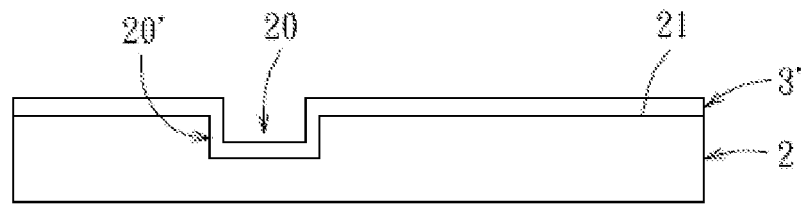
FIG. 10 is a schematic view illustrating a first step of a method for making the second preferred embodiment of a circuit substrate according to the present invention.
Figure 11:
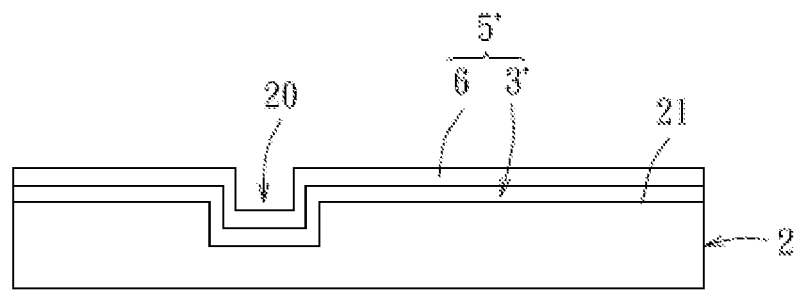
FIG. 11 is a schematic view illustrating a second step of the method for making the second preferred embodiment.
Figure 12:
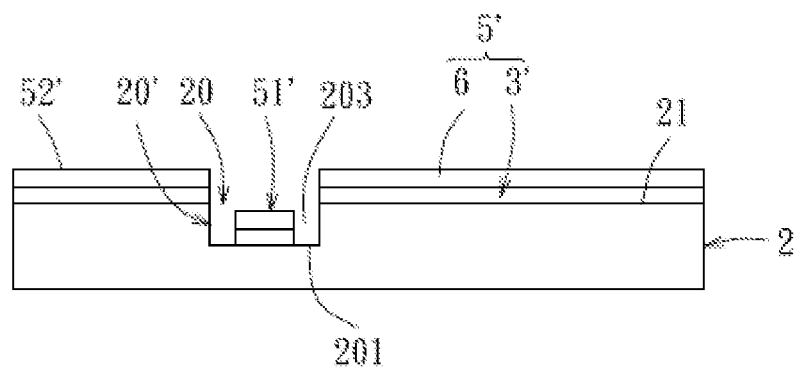
FIG. 12 is a schematic view illustrating a third step of the method for making the second preferred embodiment.
Figure 13:
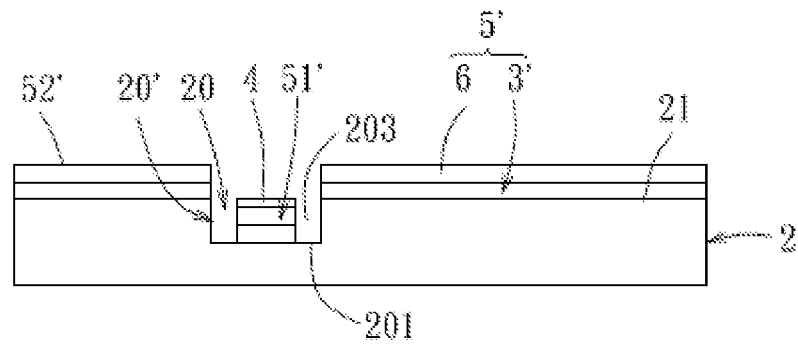
FIG. 13 is a schematic view illustrating a fourth step of the method for making the second preferred embodiment.

FIGS. 8 and 9 illustrate the first preferred embodiment of a circuit substrate 100 according to the present invention. The circuit substrate 100 includes: an insulative substrate 2 having a top surface 21 and formed with a pattern of a recess 20 that is indented from the top surface 21, the recess 20 being defined by a recess-defining wall 20' that has a bottom wall surface 201 and a surrounding wall surface 202 extending upwardly from the bottom wall surface 201; a patterned metallic layer structure 5 including at least one patterned active metal layer 3 disposed within the recess 20, formed on the bottom wall surface 201 of the recess-defining wall 20', and spaced apart from the surrounding wall surface 202 of the recess-defining wall 20' by a gap 203, a patterned active metal layer 3 containing an active metal capable of initiating electroless plating, the pattern of the patterned active metal layer 3 corresponding in shape to the pattern of the recess 20; and a primary metal layer 4 electroplated on the patterned metallic layer structure 5. The patterned metallic layer structure 5 and the primary metal layer 4 cooperatively form a circuit pattern 10 that corresponds in shape to the pattern of the recess 20. Preferably, the circuit pattern 10 has a top surface 101 substantially flush with or disposed slightly above the top surface 21 of the substrate 2.

FIGS. 1 to 9 illustrate consecutive steps of a method for making the circuit substrate 100 of the first preferred embodiment according to the present invention. The method includes the steps of: (a) providing an insulative substrate 2 having a top surface 21 (see FIG. 1); (b) forming a pattern of a recess 20 in the insulative substrate 2 such that the recess 20 is indented from the top surface 21 (see FIGS. 2 and 3); (c) forming a metallic layer structure 5' on a recess-defining wall 20' of the recess 20 and the top surface 21 of the insulative substrate 2, the metallic layer structure 5' including at least one active metal layer 3' containing an active metal capable of initiating electroless plating (see FIGS. 4 and 5); (d) removing a closed-loop portion of the metallic layer structure 5' that is disposed along a peripheral edge of a bottom wall surface 201 of the recess-defining wall 20' so as to form the metallic layer structure 5' into a first region 51 which is disposed on the bottom wall surface 201, and a second region 52 which is physically separated from the first region 51 by a gap 203 (see FIG. 6), the first region 51 of the metallic layer structure 5' defining the patterned metallic layer structure 5 of FIG. 9, the active metal layer 3' of the first region 51 of the metallic layer structure 5' defining the patterned active metal layer 3 of FIG. 9; (e) electroplating a primary metal layer 4 on the first region 51 of the metallic layer structure 5' (see FIG. 7); and (f) removing the second region 52 of the metallic layer structure 5' from the insulative substrate 2 by electrolysis (see FIGS. 8 and 9).

In this embodiment, the active metal of the active metal layer 3' is a reduced active metal. The metallic layer structure 5' is formed on the recess-defining wall 20' of the recess 20 and the top surface 21 of the insulative substrate 2 in step (c) by immersing the insulative substrate 2 into an active metal solution containing a non-reduced active metal (not shown) so as to form a non-reduced metal layer containing the non-reduced active metal on the recess-defining wall 20' of the recess 20 and the top surface 21 of the insulative substrate 2 and then reducing the non-reduced active metal of the non-reduced metal layer so as to form the active metal layer 3' containing the reduced active metal on the recess-defining wall 20' of the recess 20 and the top surface 21 of the insulative substrate 2. The primary metal layer 4 is plated on the first region 51 of the metallic layer structure 5' by electroplating techniques.

In this invention, the non-reduced active metal of the non-reduced metal layer is in the form of active metal colloid particles or metal ions.

Preferably, the active metal is selected from the group consisting of palladium, rhodium, platinum, iridium, osmium, gold, nickel, iron, and combinations thereof.

Preferably, the active metal solution containing the non-reduced active metal is palladium salt solution or palladium-tin colloid solution.

Preferably, the primary metal layer 4 is made from a metal selected from the group consisting of copper, nickel, silver, and gold.

Preferably, the insulative substrate 2 is made from a material selected from the group consisting of polycarbonate, a combination of acryl resin and acrylonitrile butadiene styrene (ABS) resin, and a combination of polycarbonate and ABS resin.

Preferably, the recess 20 in the insulative substrate 2 is formed by laser or plasma ablation.

Preferably, the closed-loop portion of the metallic layer structure 5' is removed by laser ablation.

Figure 14:
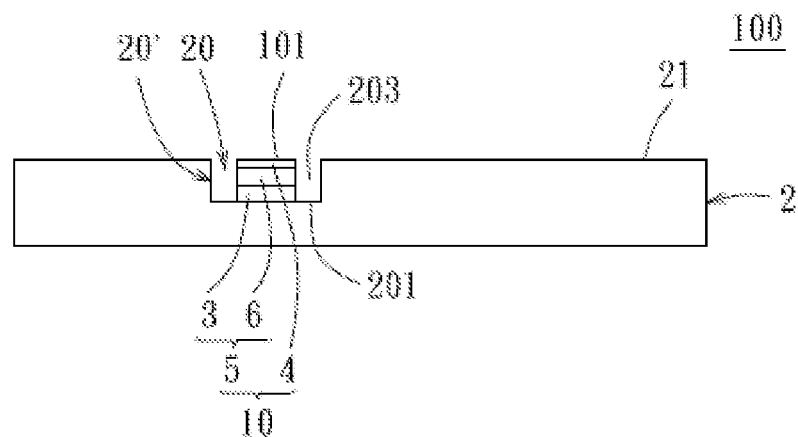
FIG. 14 is a schematic view illustrating a fifth step of the method for making the second preferred embodiment.
Figure 15:
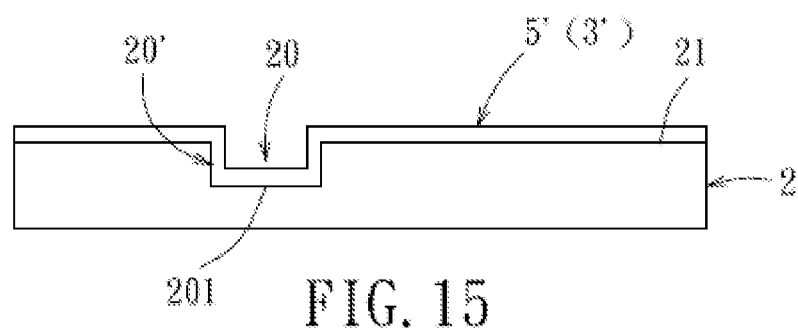
FIG. 15 is a schematic view illustrating a first step of a method for making the third preferred embodiment of a circuit substrate according to the present invention.
Figure 16:
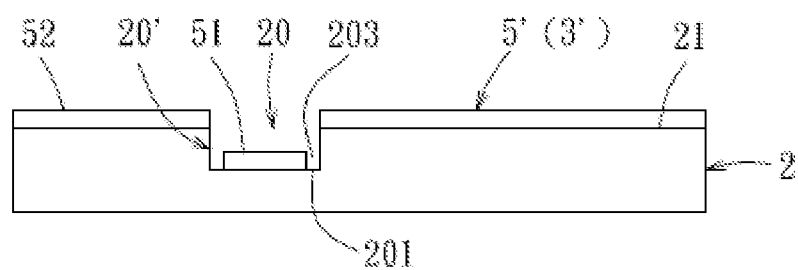
FIG. 16 is a schematic view illustrating a second step of the method for making the third preferred embodiment.
Figure 17:
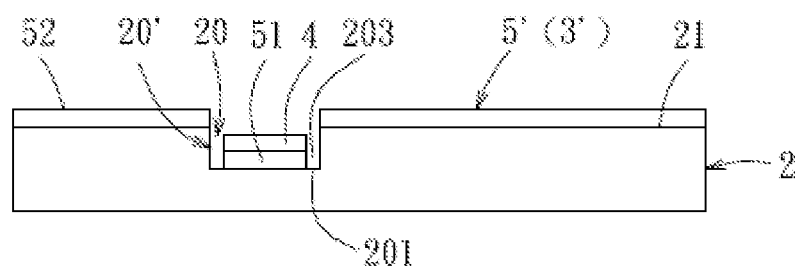
FIG. 17 is a schematic view illustrating a third step of the method for making the third preferred embodiment.
Figure 18:
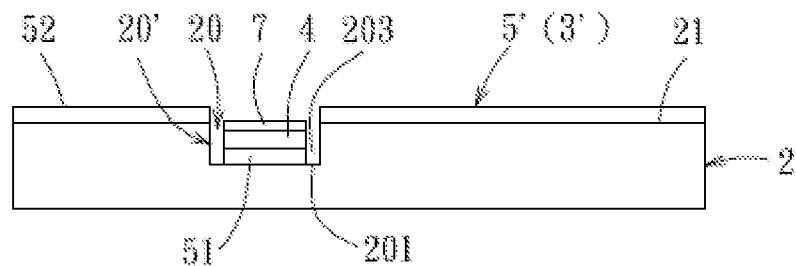
FIG. 18 is a schematic view illustrating a fourth step of the method for making the third preferred embodiment.

FIG. 14 illustrates the second preferred embodiment of a circuit substrate 100 according to the present invention. The second preferred embodiment differs from the previous embodiment in that the active metal of the patterned active metal layer 3 is a non-reduced active metal, that the patterned metallic layer structure 5 further includes an intermediate metal layer 6 which is electroless plated on the patterned active metal layer 3 and which has a pattern corresponding to that of the active metal layer 3, and that the primary metal layer 4 is electroplated on the intermediate metal layer 6. The patterned metallic layer structure 5 and the primary metal layer 4 cooperatively form the circuit pattern 10.

FIGS. 10 to 14 illustrate consecutive steps of a method for making the circuit substrate 100 of the second preferred embodiment according to the present invention. The method includes the steps of: forming a pattern of a recess 20 in the insulative substrate 2 (see FIG. 10); forming a metallic layer structure 5' on a recess-defining wall 20' of the recess 20 and a top surface 21 of the insulative substrate 2 by immersing the insulative substrate 2 into an active metal solution containing a non-reduced active metal (not shown) so as to form an active metal layer 3' containing the non-reduced active metal on the recess-defining wall 20' of the recess 20 and the top surface 21 of the insulative substrate 2 (see FIG. 10) and then electroless plating an intermediate metal layer 6 on the active metal layer 3' (see FIG. 11); removing a portion of the metallic layer structure 5' that is disposed along a peripheral edge of a bottom wall surface 201 of the recess-defining wall 20' so as to form the metallic layer structure 5' into a first region 51' which is disposed on the bottom wall surface 201, and a second region 52' which is physically separated from the first region 51' by a gap 203 (see FIG. 12), the first region 51' of the metallic layer structure 5' defining the patterned metallic layer structure 5 of FIG. 14, the active metal layer 3' of the first region 51' of the metallic layer structure 5' defining the patterned active metal layer 3 of FIG. 14; (e) electroplating a primary metal layer 4 on the intermediate metal layer 6 of the first region 51' of the metallic layer structure 5' (see FIG. 13); and (f) removing the second region 52' of the metallic layer structure 5' from the insulative substrate 2 by electrolysis (see FIG. 14).

Figure 19:
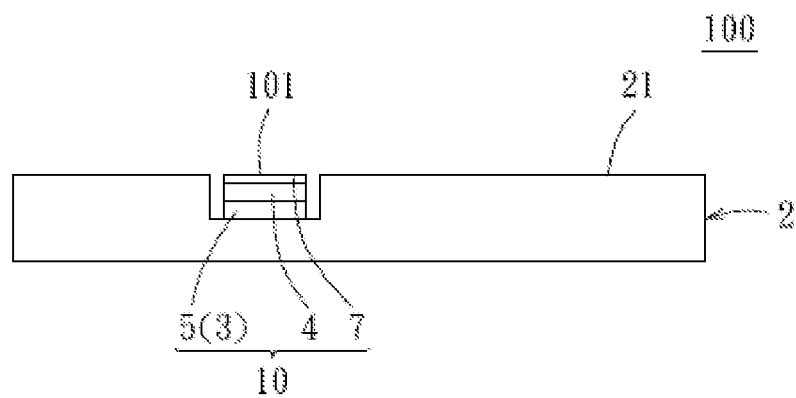
FIG. 19 is a schematic view illustrating a fifth step of the method for making the third preferred embodiment.

FIG. 19 illustrates the third preferred embodiment of a circuit substrate 100 according to the present invention. The third preferred embodiment differs from the first preferred embodiment in that the active metal of the patterned active metal layer 3 is a non-reduced active metal, that the primary metal layer 4 is electroless plated on the patterned active metal layer 3, and that a top metal layer 7 is formed on the primary metal layer 4. Although the way of making the third preferred embodiment is different from that of the second preferred embodiment, the third preferred embodiment has a structure similar to that of the second preferred embodiment as the primary metal layer 4 and the top metal layer 7 of the third preferred embodiment are equivalent to the intermediate metal layer 6 and the primary metal layer 4 of the second preferred embodiment, respectively.

FIGS. 15 to 19 illustrate consecutive steps of a method for making the circuit substrate 100 of the third preferred embodiment according to the present invention. The method includes the steps of: forming a pattern of a recess 20 in the insulative substrate 2 (see FIG. 15); forming a metallic layer structure 5' on a recess-defining wall 20' of the recess 20 and a top surface 21 of the insulative substrate 2 by immersing the insulative substrate 2 into an active metal solution containing a non-reduced active metal (not shown) so as to form an active metal layer 3' containing the non-reduced active metal on the recess-defining wall 20' of the recess 20 and the top surface 21 of the insulative substrate 2 (see FIG. 15); removing a portion of the metallic layer structure 5' that is disposed along a peripheral edge of a bottom wall surface 201 of the recess-defining wall 20' so as to form the metallic layer structure 5' into a first region 51 which is disposed on the bottom wall surface 201, and a second region 52 which is physically separated from the first region 51 by a gap 203 (see FIG. 16), the first region 51 of the metallic layer structure 5' defining the patterned metallic layer structure 5 of FIG. 19, the active metal layer 3' of the first region 51 of the metallic layer structure 5' defining the patterned active metal layer 3 of FIG. 19; (e) electroless plating a primary metal layer 4 on the active metal layer 3' of the first region 51 of the metallic layer structure 5' (see FIG. 17); electroplating a top metal layer 7 on the primary metal layer 4 (see FIG. 18); and (f) removing the second region 52 of the metallic layer structure 5' from the insulative substrate 2 by electrolysis (see FIG. 19).

By forming a recess 20 in the insulative substrate 2 and a metallic layer structure 5' including at least one active metal layer 3' (which is formed by contacting the insulative substrate 2 with an active metal solution) in the recess 20 and subsequently removing a portion of the metallic layer structure 5' from the insulative substrate 2 according to the method of this invention, the aforesaid drawbacks associated with the prior art can be alleviated.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A method for making a circuit substrate having a circuit pattern, the method comprising:
   (a) providing an insulative substrate having a top surface;
   (b) forming a pattern of a recess in the insulative substrate such that the recess is indented from the top surface, the recess being defined by a recess-defining wall having a bottom wall surface and a surrounding wall surface extending upwardly from the bottom wall surface;
   (c) forming a metallic layer structure on the recess-defining wall of the recess and the top surface of the insulative substrate, the metallic layer structure including at least one active metal layer containing an active metal capable of initiating electroless plating;
   (d) removing a portion of the metallic layer structure that is disposed along a peripheral edge of the bottom wall surface of the recess-defining wall so as to form the metallic layer structure into a first region which is disposed on the bottom wall surface, and a second region which is physically separated from the first region; and
   (e) plating a primary metal layer on the first region of the metallic layer structure.

2. The method of claim 1, wherein, in step (b), the recess in the insulative substrate is formed by laser or plasma ablation.

3. The method of claim 1, wherein, in step (d), the portion of the metallic layer structure is removed by laser ablation.

4. The method of claim 1, wherein in step (e), the primary metal layer has a top surface substantially flush with or disposed above the top surface of the insulative substrate.

5. The method of claim 1, wherein, in step (c), the active metal of the active metal layer is a reduced active metal, and the metallic layer structure is formed on the recess-defining wall of the recess and the top surface of the insulative substrate by immersing the insulative substrate into an active metal solution containing a non-reduced active metal so as to form a non-reduced metal layer containing the non-reduced active metal on the recess-defining wall of the recess and the top surface of the insulative substrate and then reducing the non-reduced active metal of the non-reduced metal layer so as to form the active metal layer containing the reduced active metal.

6. The method of claim 5, wherein, in step (e), the primary metal layer is formed on the first region of the metallic layer structure by electroplating.

7. The method of claim 1, wherein, in step (c), the active metal of the active metal layer is a non-reduced active metal, and the metallic layer structure is formed on the recess-defining wall of the recess and the top surface of the insulative substrate by immersing the insulative substrate into an active metal solution containing the non-reduced active metal so as to form the active metal layer containing the non-reduced active metal on the recess-defining wall of the recess and the top surface of the insulative substrate and then electroless plating an intermediate metal layer on the active metal layer.

8. The method of claim 7, wherein, in step (e), the primary metal layer is formed on the intermediate metal layer of the first region of the metallic layer structure by electroplating.

9. The method of claim 1, further comprising, after step (e), removing the second region of the metallic layer structure from the insulative substrate.

10. The method of claim 9, wherein the second region of the metallic layer structure is removed from the insulative substrate by electrolysis.

11. The method of claim 1, wherein, in step (c), the active metal of the active metal layer is a non-reduced active metal, and the metallic layer structure is formed on the recess-defining wall of the recess and the top surface of the insulative substrate by immersing the insulative substrate into an active metal solution containing the non-reduced active metal so as to form the active metal layer containing the non-reduced active metal on the recess-defining wall of the recess and the top surface of the insulative substrate.

12. The method of claim 11, wherein, in step (e), the primary metal layer is formed on the active metal layer of the first region of the metallic layer structure by electroless plating.

13. The method of claim 12, further comprising, after step (e), electroplating a top metal layer on the primary metal layer.

14. A method for making a circuit substrate having a circuit pattern, the method comprising:
(a) providing an insulative substrate having a top surface;
(b) forming a pattern of a recess in the insulative substrate by a laser such that the recess is indented from the top surface, the recess being defined by a recess-defining wall having a bottom wall surface and a surrounding wall surface extending upwardly from the bottom wall surface;
(c) forming a metallic layer structure on the recess-defining wall of the recess and the top surface of the insulative substrate, the metallic layer structure including at least one active metal layer containing an active metal capable of initiating electroless plating;
(d) removing a portion of the metallic layer structure that is disposed along a peripheral edge of the bottom wall surface of the recess-defining wall so as to form the metallic layer structure into a first region which is disposed on the bottom wall surface, and a second region which is physically separated from the first region; and
(e) electroless plating a primary metal layer on the first region of the metallic layer structure.

15. The method of claim 14, further comprising, after step (e), electroplating a top metal layer on the primary metal layer.

16. The method of claim 14, wherein, in step (d), the portion of the metallic layer structure is removed by laser ablation.

17. A method for making a circuit substrate having a circuit pattern, the method comprising:
(a) providing an insulative substrate having a top surface;
(b) forming a pattern of a recess in the insulative substrate by a laser such that the recess is indented from the top surface, the recess being defined by a recess-defining wall having a bottom wall surface and a surrounding wall surface extending upwardly from the bottom wall surface;
(c) forming a metallic layer structure on the recess-defining wall of the recess and the top surface of the insulative substrate, the metallic layer structure including at least one active metal layer containing an active metal capable of initiating electroless plating;
(d) removing a portion of the metallic layer structure that is disposed along a peripheral edge of the bottom wall surface of the recess-defining wall by laser ablation so as to form the metallic layer structure into a first region which is disposed on the bottom wall surface, and a second region which is physically separated from the first region; and
(e) plating a primary metal layer on the first region of the metallic layer structure.

18. The method of claim 17, wherein in step (e), the primary metal layer has a top surface substantially flush with or disposed above the top surface of the insulative substrate.

19. The method of claim 17, wherein, in step (e), the primary metal layer is formed on the active metal layer of the first region of the metallic layer structure by electroless plating.

20. The method of claim 19, further comprising, after step (e), electroplating a top metal layer on the primary metal layer.

* * * * *